US007763112B2

(12) United States Patent
Gonzalez-Zugasti et al.

(10) Patent No.: US 7,763,112 B2
(45) Date of Patent: Jul. 27, 2010

(54) METHODS AND SYSTEMS FOR CO-CRYSTAL SYNTHESIS

(75) Inventors: Javier Gonzalez-Zugasti, North Billerica, MA (US); Nathan Kane, Arlington, MA (US); Mark Oliveira, Framingham, MA (US); Matthew Peterson, Hopkinton, MA (US)

(73) Assignee: TransForm Pharmaceuticals, Inc., Lexington, MA (US)

( * ) Notice: Subject to any disclaimer, the term of this patent is extended or adjusted under 35 U.S.C. 154(b) by 915 days.

(21) Appl. No.: 11/413,353

(22) Filed: Apr. 28, 2006

(65) Prior Publication Data

US 2006/0243831 A1    Nov. 2, 2006

Related U.S. Application Data

(60) Provisional application No. 60/676,646, filed on Apr. 29, 2005.

(51) Int. Cl.
*C30B 7/02* (2006.01)
(52) U.S. Cl. .............................. 117/68; 117/69; 117/70; 117/3
(58) Field of Classification Search ................ 117/1, 117/3, 68, 69, 70; 241/3, 171
See application file for complete search history.

(56) References Cited

U.S. PATENT DOCUMENTS

2004/0146434 A1*  7/2004  Kane et al. ................ 422/100
2006/0243831 A1* 11/2006  Gonzalez-Zugasti et al. .. 241/23

OTHER PUBLICATIONS

"Crystal engineering of the composition of pharmaceutical phases. Do pharmaceutical co-crystals represent a new path to improved medicines?", Almarsson, et al; Chemicical Communications, 2004, pp. 1889-1896.*

* cited by examiner

*Primary Examiner*—Robert M Kunemund
(74) *Attorney, Agent, or Firm*—Woodcock Washburn, LLP

(57) ABSTRACT

The present invention comprises methods and apparatuses for the production or formation of co-crystals. The methods and apparatuses can be used to grind two or more co-crystal components resulting in the formation of co-crystals. The resultant co-crystals can have several uses as disclosed herein.

12 Claims, 2 Drawing Sheets

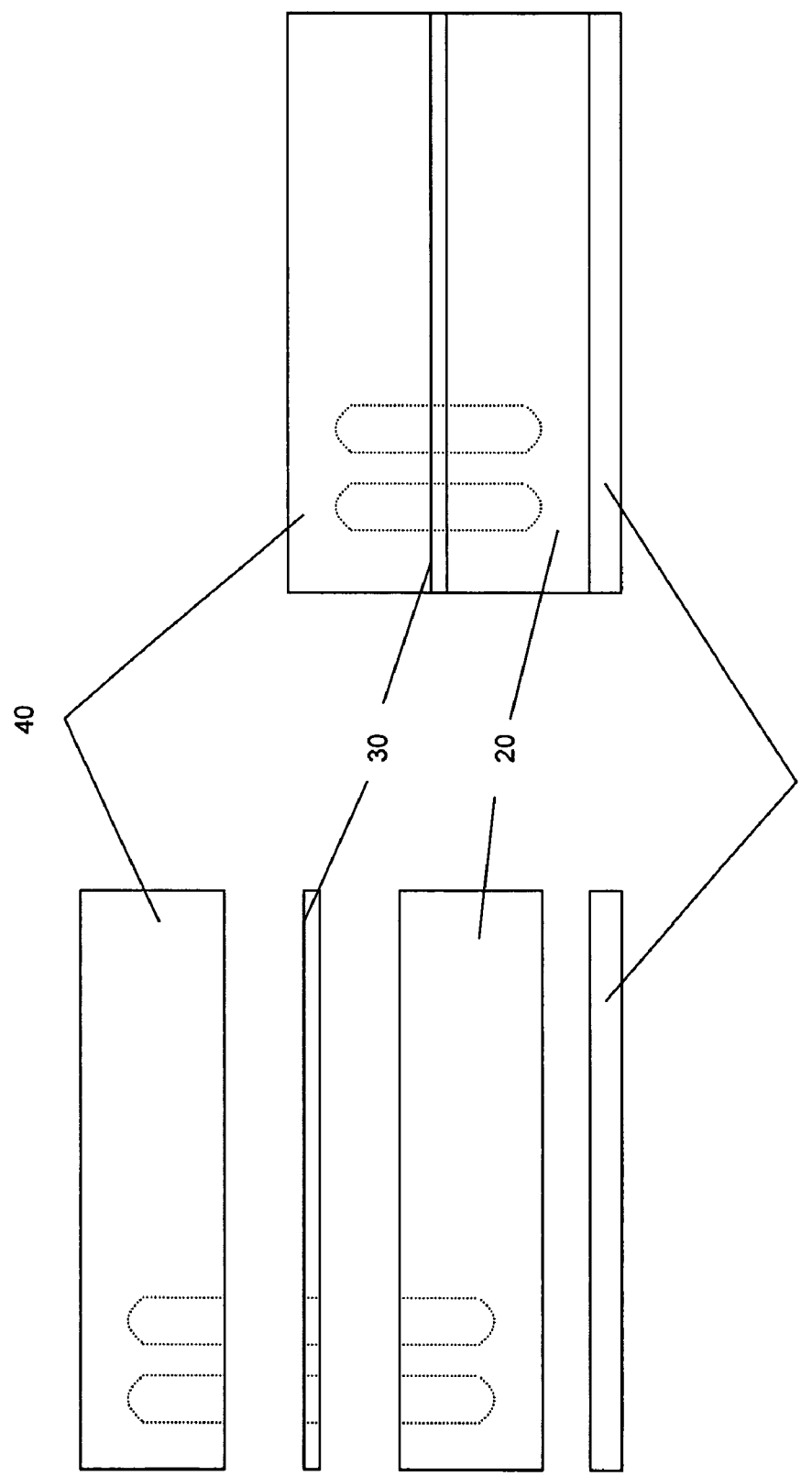

METHODS AND SYSTEMS FOR CO-CRYSTAL SYNTHESIS

BACKGROUND OF THE INVENTION

Co-Crystals have many diverse applications. For example, co-crystals have been proposed for nonlinear optical materials and for new types of materials for pharmaceutical development. Typical methods of growing co-crystals include, but are not limited to, melt crystallization, re-crystallization from solvents, and solid-state grinding. Solid state grinding, as a method of forming co-crystals, has been deemed to be slow or require strict conditions on the melting points of the components. The present invention comprises methods and apparatuses for the timely formation of co-crystals without limitations of the components' melting points.

Based on the above, there is a need for improved methods for producing co-crystals by grinding.

SUMMARY OF THE INVENTION

In a first embodiment of this invention, a method of producing co-crystals is provided by:
 (a) providing a mixture of co-crystal components to at least one well of a body;
 (b) providing at least one grinding ball to said at least one well of said body;
 (c) affixing said body to a shaking component;
 (d) selecting a vibration frequency and a vibration amplitude for said shaking component; and
 (e) vibrating said body, whereby said vibrating results in co-crystal formation.

In another embodiment, a method of producing co-crystals is provided by:
 (a) providing a mixture of co-crystal components to at least one well of a body;
 (b) providing at least one grinding ball to said at least one well of said body;
 (c) affixing a cover plate, that is substantially physically congruent to said body, to said body;
 (d) affixing said body to a shaking component;
 (e) selecting a vibration frequency and a vibration amplitude for said shaking component; and
 (f) vibrating said body, whereby said vibrating results in co-crystal formation.

In another embodiment of this invention, an apparatus for producing co-crystals comprises:
 (a) a body comprising at least one well;
 (b) a shaking component capable of shaking said body; and
 (c) at least one grinding ball.

In another embodiment, an apparatus for producing co-crystals comprises:
 (a) a body comprising at least one well;
 (b) a cover plate substantially physically congruent to said body;
 (c) a shaking component capable of shaking said body and cover plate; and
 (d) at least one grinding ball.

In another embodiment, said shaking component produces a vibration frequency and a vibration amplitude which are selected to maximize the impact energy of said at least one grinding ball. In another embodiment, said body and cover plate have sufficient material strength to withstand the formation of cracks and other material failures potentially produced by the shaking of said at least one grinding ball. In another embodiment, said body and cover plate are formed of a material that is substantially chemically inert. In another embodiment, said at least one grinding ball is formed of a material that is substantially chemically inert. In another embodiment, said at least one grinding ball is coated with a material that is substantially chemically inert.

In another embodiment, the apparatus of this invention includes a plurality of wells. For example, 2, 3, 4, 5, 6, 7, 8, 9, 10, 12, 18, 24, 36, 48, 96, 192, 256, 512, or 1024 wells, or any integer number of wells between 1 and 1024, inclusive.

For a better understanding of the present invention, together with other and further needs thereof, reference is made to the accompanying drawings and detailed description.

BRIEF DESCRIPTION OF THE DRAWINGS

FIG. 2 is a schematic representation of an embodiment of this invention.

DETAILED DESCRIPTION OF THE INVENTION

Figure 1:
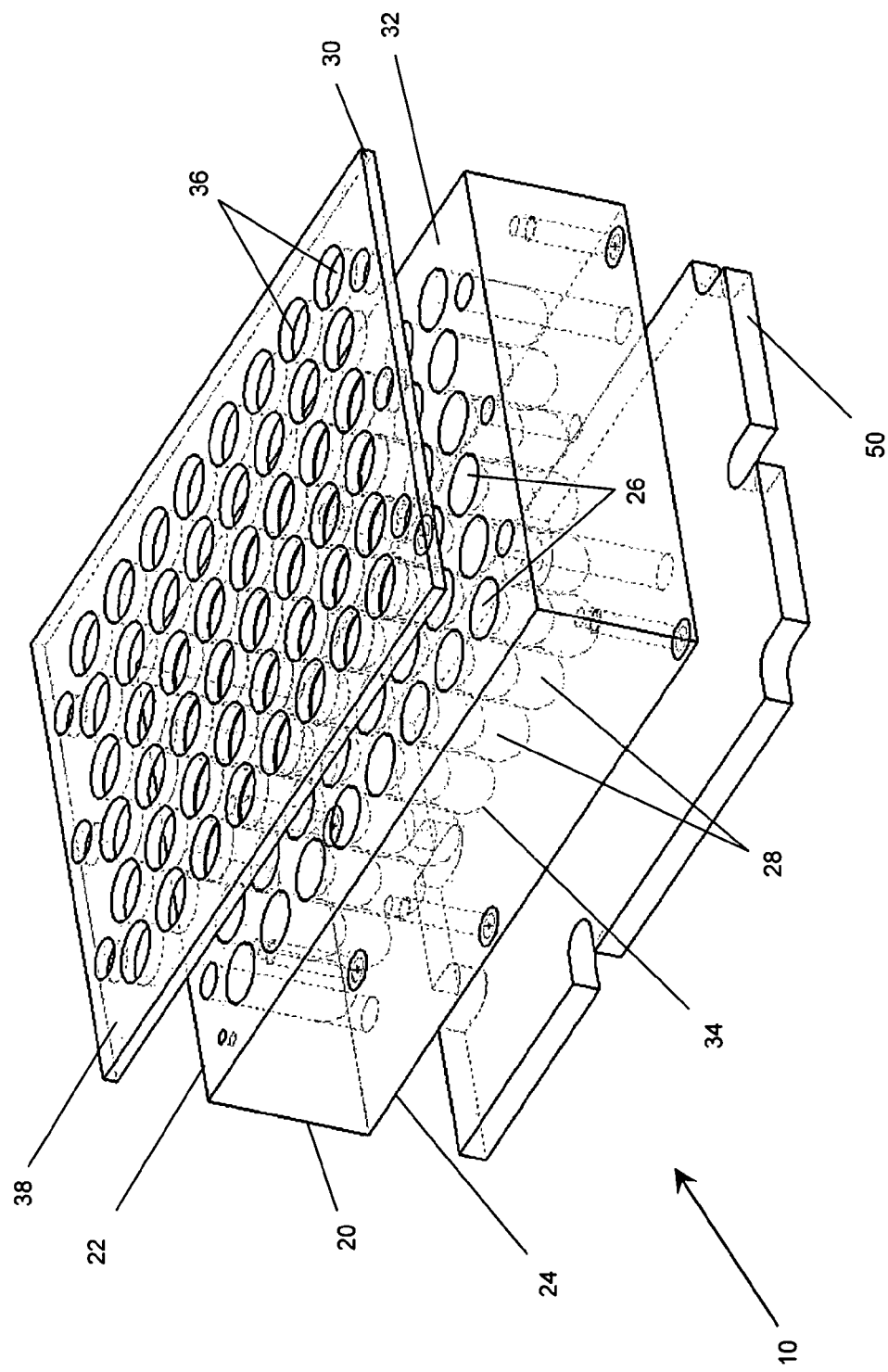
FIG. 1 is a schematic representation of an embodiment of this invention.

The term "dry grinding" can be used to describe the present method of producing co-crystals without the addition of solvent to said at least one well.

The term "wet grinding" can be used to describe the present method of producing co-crystals with the addition of solvent to said at least one well.

A "small amount" of solvent can be defined as up to about 40 percent by weight (w/w). For example, a weight percent of less than or equal to about 1, 2, 3, 4, 5, 10, 15, 20, 25, 30, 35, 40 or an intermediate amount can be considered a small amount of solvent. The weight percent of solvent can be determined by the weight of the solvent added with respect to the weight of the solvent, API, and co-crystal former combined.

A "small amount" of solvent can also be defined as an amount of solvent which solubilizes less than about 1, 2, 3, 4, or 5 percent by weight of the total API and co-crystal former.

The term "co-crystal component" is defined as a material with a melting point above room temperature (about 22 degrees C.) and is capable of forming a co-crystal as defined herein.

The term "co-crystal" as used herein means a crystalline material comprised of two or more unique solids at room temperature (22 degrees C.), each containing distinctive physical characteristics, such as structure, melting point and heats of fusion, with the exception that, if specifically stated, the active pharmaceutical ingredient (API) in an API-containing co-crystal may be a liquid at room temperature. The co-crystals of the present invention comprise a co-crystal former H-bonded to an API, agrochemical, nutraceutical, excipient, permeation enhancer, or another molecule. The co-crystal former may be H-bonded directly to the API, agrochemical, nutraceutical, excipient, permeation enhancer, or other molecule or may be H-bonded to an additional molecule which is bound to the API, agrochemical, nutraceutical, excipient, permeation enhancer, or other molecule. The additional molecule may be H-bonded to the API, agrochemical, nutraceutical, excipient, permeation enhancer, or other molecule or bound ionically or covalently to the API, agrochemical, nutraceutical, excipient, permeation enhancer, or other molecule. The additional molecule could also be a different API, agrochemical, nutraceutical, excipient, permeation enhancer, or other molecule. Solvates of an API, agrochemical, nutraceutical, excipient, permeation enhancer, or other molecule that do not further comprise a co-crystal former are not co-crystals according to the present invention. The co-crystals may however, include one or more solvate molecules in the crystalline lattice. That is, a solvate of a co-crystal, or a co-crystal further comprising a solvent or compound that is a liquid at room temperature, is a co-crystal according to the present invention, but crystalline material comprised of only one solid and one or more liquids (at room temperature) are not co-crystals for purposes of the present invention, with the previously noted exception of specifically stated liquid APIs. The co-crystals may also be a co-crystal between a co-crystal former and a salt of an API, agrochemical, nutraceutical, excipient, permeation enhancer, or another molecule, but the API, agrochemical, nutraceutical, excipient, permeation enhancer, or other molecule and the co-crystal former of the present invention are constructed or bonded together through hydrogen bonds. Other modes of molecular recognition may also be present including, pi-stacking, guest-host complexation and van der Waals interactions. Of the interactions listed above, hydrogen-bonding is the dominant interaction in the formation of the co-crystal, (and a required interaction according to the present invention) whereby a non-covalent bond is formed between a hydrogen bond donor of one of the moieties and a hydrogen bond acceptor of the other. Hydrogen bonding can result in several different intermolecular configurations. For example, hydrogen bonds can result in the formation of dimers, linear chains, or cyclic structures. These configurations can further include extended (two-dimensional) hydrogen bond networks and isolated triads.

The term "pharmaceutical co-crystal" as used herein describes a co-crystal wherein at least one of the components is an API.

The term "well" is defined herein to mean a space having walls separated by at least about 1.00 mm. For example, from about 1.00 mm to about 30.00 mm, from about 5.00 mm to about 15.00 mm, or from about 5.00 mm to about 10.00 mm, in at least one dimension. The wells can be described as, for example, those found in 24, 48, 96, or 384 well-plates or microtitre plates. In one embodiment, the wells are cylindrical in their interior shapes and, optionally, can terminate on one or both ends with a spherical end. According to the present invention, a "well plate" or a "body" can include 1, 2, 3, 4, 8, 16, 32, 64, 96, 128, 256, 1024 or more wells (or any integer number of wells from 1 through 1024, inclusive).

Methods and systems for producing co-crystals by grinding are disclosed herein.

In one embodiment of this invention, a method of producing co-crystals is provided by:
(a) providing a mixture of co-crystal components to at least one well of a body;
(b) providing at least one grinding ball to said at least one well of said body;
(c) affixing said body to a shaking component;
(d) selecting a vibration frequency and a vibration amplitude for said shaking component; and
(e) vibrating said body, whereby said vibrating results in co-crystal formation.

In another embodiment, the above method further comprises providing a small amount of solvent to at least one well prior to step (e).

In another embodiment, a method of producing co-crystals is provided by:
(a) providing a mixture of co-crystal components to at least one well of a body;
(b) providing at least one grinding ball to said at least one well of said body;
(c) affixing a cover plate, that is substantially physically congruent to said body, to said body;
(d) affixing said body to a shaking component;
(e) selecting a vibration frequency and a vibration amplitude for said shaking component; and
(f) vibrating said body, whereby said vibrating results in co-crystal formation.

In another embodiment, the above method further comprises providing a small amount of solvent to at least one well prior to step (c).

In another embodiment, a solvent for use in the wet grinding of co-crystal components solubilizes less than or about 5 percent by weight of the solids. In another embodiment, a solvent for use in the wet grinding of co-crystal components solubilizes less than or about 4 percent by weight of the solids. In another embodiment, a solvent for use in the wet grinding of co-crystal components solubilizes less than or about 3 percent by weight of the solids. In another embodiment, a solvent for use in the wet grinding of co-crystal components solubilizes less than or about 2 percent by weight of the solids. In another embodiment, a solvent for use in the wet grinding of co-crystal components solubilizes less than or about 1 percent by weight of the solids.

Solvents used in such a wet co-crystallization process can be, for example, but not limited to, acetone, methanol, ethanol, isopropyl alcohol, ethyl acetate, isopropyl acetate, nitromethane, dichloromethane, chloroform, toluene, propylene glycol, dimethyl sulfoxide (DMSO), dimethyl formamide (DMF), diethyl ether (ether), ethyl formate, hexane, acetonitrile, or another organic solvent including alcohols.

In another embodiment, a gasket plate is inserted between the affixed body and cover plate. In another embodiment, the gasket plate comprises one or more openings which correspond to the one or more wells of said body and cover plate.

In another embodiment, said mixture of co-crystal components is provided via simultaneous dispensing of two or more co-crystal components. In another embodiment, said mixture of co-crystal components is provided via an automated dispensing system. In another embodiment, said mixture of co-crystal components is provided via an AutoDose automated dispensing system. In another embodiment, said mixture of co-crystal components is provided via one or more coring tools (See e.g., U.S. Published Application No. 20040146434).

In another embodiment, said mixture of co-crystal components comprises any two or more solids at room temperature (about 22 degrees C.). In another embodiment, said mixture of co-crystal components comprises one or more materials selected from the group consisting of: active pharmaceutical ingredients (APIs), agrochemicals, nutraceuticals, excipients, and permeation enhancers. In another embodiment, said mixture of co-crystal components comprises two materials selected from the group consisting of: active pharmaceutical ingredients (APIs), agrochemicals, nutraceuticals, excipients, and permeation enhancers.

In another embodiment, one or more wells have a maximum diameter of between about 1.00 mm and about 30.00 mm. In another embodiment, one or more wells have a maximum diameter of between about 5.00 mm and about 15.00 mm. In another embodiment, one or more wells have a maximum diameter of between about 5.00 mm and about 10.00 mm. For example, about 5.00, 5.50, 6.00, 6.50, 7.00, 7.50, 8.00, 8.50, 9.00, 9.50, or 10.00 mm. In another embodiment, one or more wells are cylindrical in shape. In another embodiment, one or more wells have an end-to-end length of between about 0.50 cm and about 25.00 cm. In another embodiment, one or more wells have an end-to-end length of between about 1.00 cm and about 10.00 cm. In another embodiment, one or more wells have an end-to-end length of between about 1.00 cm and about 5.00 cm. For example, about 1.00, 1.50, 2.00, 2.50, 3.00, 3.50, 4.00, 4.50, or 5.00 cm. In certain embodiments, the end-to-end length of a well can be measured from the bottom of a well in the body to the top of the well in the cover plate, for example, see FIG. 2. Such a measurement can also include the gasket plate in embodiments where such a plate is used. In another embodiment, one or more wells terminate at one end with a spherical shape. In another embodiment, one or more wells terminate at both ends with a spherical shape. In another embodiment, the well or wells (body) and/or cover plate are formed using the material polyetheretherketone (PEEK). In another embodiment, a high performance thermoplastic material can be used to fabricate the body, cover plate, or both. Other feasible materials which can be used to form the body and/or cover plate include, but are not limited to, stainless steel, titanium, bronze, polymer coated aluminum, nylon, and various glass filled plastics.

In another embodiment, said at least one grinding ball is substantially chemically inert or coated with a substantially chemically inert coating. In another embodiment, said at least one grinding ball is magnetic. In another embodiment, said at least one grinding ball is composed of a hard, dense material. In another embodiment, said at least one grinding ball is composed of a material selected from the group consisting of: stainless steel, tungsten carbide, bronze, brass, glass, and ceramics. In another embodiment, said at least one grinding ball is composed of 400 series stainless steel. In another embodiment, said at least one grinding ball is composed of 440C stainless steel. In another embodiment, said at least one grinding ball is composed of tungsten carbide and is coated with a chemically inert coating. In another embodiment, said at least one grinding ball is substantially spherical. In another embodiment, said at least one grinding ball is spherical. In another embodiment, said at least one grinding ball has a smaller diameter than the diameter of the well. In another embodiment, said at least one grinding ball has a diameter that is about 1.00 mm less than the diameter of the well. In another embodiment, said at least one grinding ball has a diameter that is about 0.50, 0.60. 0.70, 0.80, 0.90, 1.00, 1.10, 1.20, 1.30, 1.40, 1.50, 1.60, 1.70, 1.80, 1.90, 2.00, 2.20, 2.40, 2.60, 2.80, 3.00, 3.20, 3.40, 3.60, 3.80, 4.00, 4.20, 4.40, 4.60, 4.80, 5.00, 5.25, 5.50, 5.75, 6.00, 6.25, 6.50, 6.75, 7.00, 7.25, 7.50, 7.75, 8.00, 8.25, 8.50, 8.75, 9.00, 9.25, 9.50, 9.75, or 10.00 mm, or an intermediate value, less than the diameter of the well, to insure free movement with the powder present. In another embodiment, said at least one grinding ball has a diameter of from about 1/16 inches to about 1 inch, or from about 1/16 inches to about 3/4 inches, or from about 1/8 inches to about 1/2 inches. In another embodiment, said at least one grinding ball has a diameter of about 1/4, 3/32, or 3/16 inches. In another embodiment, said at least one grinding ball has a diameter of about from 0.50 to about 0.90 times the diameter of the well. In another embodiment, said at least one grinding ball has a diameter of about from 0.65 to about 0.80 times the diameter of the well. In another embodiment, two or more grinding balls are provided in the well. For example, 2, 3, 4, 5, 6, 7, 8, 9, 10, or more grinding balls can be provided in the well.

In another embodiment, said at least one grinding ball has a density of at least 6000 kg/m$^3$. In another embodiment, said at least one grinding ball has a density of at least 7000 kg/m$^3$. In another embodiment, said at least one grinding ball has a density of between about 6000 and 8000 kg/m$^3$. In another embodiment, said at least one grinding ball has a density of between about 7000 and 8000 kg/m$^3$. In another embodiment, said at least one grinding ball has a density of about 7000, 7100, 7200, 7300, 7400, 7500, 7600, 7700, 7800, 7900, or 8000 kg/m$^3$, or an intermediate value.

The vibration frequency can range from about 10 Hz to about 1000 Hz. In another embodiment, the vibration frequency ranges from about 30 Hz to about 250 Hz. In another embodiment, the vibration frequency is about 30, 35, 40, 45, 50, 55, 60, 65, 70, 75, 80, 85, 90, 95, or 100 Hz, or any intermediate value. For example, the vibration frequency can be about 35 Hz or about 53 Hz. In another embodiment, the vibration frequency is tunable. In another embodiment, the vibration frequency is controlled via a computer. In another embodiment, the vibration frequency is varied during the grinding period.

The vibration amplitude can range from about 5.00 mm to about 500.00 mm. In another embodiment, the vibration amplitude ranges from about 10.00 mm to about 100.00 mm. In another embodiment, the vibration amplitude is about 10.00, 11.00, 12.00, 13.00, 14.00, 15.00, 16.00, 17.00, 18.00, 19.00, 20.00, 21.00, 22.00, 23.00, 24.00, 25.00, 26.00, 27.00, 28.00, 29.00, 30.00, 31.00, 32.00, 33.00, 34.00, 35.00, 36.00, 37.00, 38.00, 39.00, 40.00, 41.00, 42.00, 43.00, 44.00, 45.00, 46.00, 47.00, 48.00, 49.00, or 50.00 mm, or any intermediate value. For example, the vibration amplitude can be about 17.8 mm or about 31.8 mm.

The vibration of said apparatus can be completed over a duration of up to about 2 hours, thus resulting in co-crystal formation. Grinding of the co-crystal components can be completed by vibration of said apparatus. In another embodiment, grinding is completed over a duration of from about 1 minute up to about 60 minutes. For example, about 5, 10, 15, 20, 25, 30, 35, 40, 45, 50, 55, or 60 minutes, or any intermediate duration.

In another embodiment of this invention, an apparatus for producing co-crystals comprises:
  (a) a body comprising at least one well;
  (b) a shaking component capable of shaking said body; and
  (c) at least one grinding ball.

In another embodiment, an apparatus for producing co-crystals comprises:
  (a) a body comprising at least one well;
  (b) a cover plate substantially physically congruent to said body;
  (c) a shaking component capable of shaking said body and cover plate; and
  (d) at least one grinding ball.

In another embodiment, said shaking component produces a vibration frequency and a vibration amplitude which are selected to maximize the impact energy of said at least one grinding ball. In another embodiment, said body and cover plate have sufficient material strength to withstand the formation of cracks and other material failures potentially produced by the shaking of said at least one grinding ball. In another embodiment, said body and cover plate are formed of a material that is substantially chemically inert. In another embodiment, said at least one grinding ball is formed of a material that is substantially chemically inert. In another embodiment, said at least one grinding ball is coated with a material that is substantially chemically inert.

In another embodiment, the apparatus further comprises a gasket plate. In another embodiment, the gasket plate comprises one or more openings which correspond to one or more wells of said body and cover plate.

In another embodiment, the apparatus of this invention includes a plurality of wells. For example, 2, 3, 4, 5, 6, 7, 8, 9, 10, 12, 18, 24, 36, 48, 96, 192, 256, 384, 512, or 1024 wells, or any integer number of wells between 1 and 1024. In another embodiment, the apparatus includes a plurality of wells in a well-plate. In another embodiment, the apparatus includes a plurality of wells, each of similar size and shape. In another embodiment, the apparatus includes a plurality of wells, wherein at least one well has a different size or shape or both than at least one other well.

In another embodiment, the apparatus is cooled during grinding. In another embodiment, the apparatus is heated during grinding. In another embodiment, the apparatus is maintained at about room temperature (about 22 degrees C.) during grinding.

While not being bound by theory, an important factor in triggering co-crystal formation is the energy imparted by the grinding ball to the co-crystal components (powder) mixture at each impact. The energy per impact is equal to $\frac{1}{2} (m) (Aw)^2$, where m is the ball mass, A is the motion amplitude, and w is the frequency of the vibration in radians per second. Another factor that may trigger co-crystal formation is the maximum impact pressure exerted on the powder, which depends on the ball energy, the contact area at impact, the powder, and the ball and block material hardness. In another embodiment, co-crystal formation may be enhanced by increasing the motion amplitude, frequency, ball density, and/or the hardness of the materials. No restrictions are placed in this invention on the relative values of the melting points of the co-crystal components. For example, two or more co-crystal components with melting points more than 30, 35, 40, 45, or 50 degrees apart can be used to form co-crystals with the present methods and/or apparatuses.

One embodiment of the apparatus of this invention includes a body, a cover plate, a shaking component, capable of shaking the body and cover plate, a vibration frequency and a vibration amplitude produced by the shaking component being selected to maximize impact energy of grinding balls, the body and cover plate having sufficient material strength to withstand the formation and cracking produced by the shaking of the grinding balls and being formed of a material that is substantially chemically inert.

Other embodiments of the apparatus of this invention include multiple wells.

In another embodiment of the apparatus of this invention, as shown in FIG. 1, the component 10 providing a plurality of wells, includes a body 20 having a substantially flat upper end 22 and a substantially flat lower end 24, where the substantially flat upper end 22 has a first number of openings 26 arranged in a predetermined pattern, the first number of openings 26 arranged in the first predetermined pattern constituting a first array of openings 32. The body 20 also includes a number of inner spaces, each of the inner spaces connecting to one of the openings 26 in the substantially flat upper end 22 and constituting a channel 28 extending from the opening 26 to a point inside the body 20. The height of each channel 28 is less than the distance from the substantially flat upper end 22 to the substantially flat lower end 24. In one embodiment, each channel terminates in a spherical cap 34, the spherical cap 34 being concave towards the corresponding opening 26. The embodiment of the invention shown in FIG. 1 also includes a gasket plate 30 having a second number of openings 36 arranged in a second predetermined pattern, the second number of openings 36 arranged in the second predetermined pattern constituting a second array of openings 38. The second array of openings 38 is substantially congruent to the first array of openings 32. The gasket plate 30 is disposed on the upper end 22 of the body 20 and the second array of openings 38 is substantially physically congruent with the first array of openings 32.

A cover plate 40 (shown in FIG. 2) comprises a third number of openings, arranged in a third predetermined pattern, the third number of openings arranged in the third predetermined pattern constituting a third array of openings. The cover plate 40 also comprises channels associated with each opening. The third array of openings is substantially congruent to the second array of openings 38. The cover plate 40 is disposed on the gasket plate 30 and the third array of openings is substantially physically congruent with the second array of openings 38. In another embodiment, base plate 50 is used to mount the apparatus to a shaking component. (The cover plate 40 is not shown in FIG. 1 for clarity.) In another embodiment, the cover plate 40 is substantially similar to the body 20. The cover plate 40 is mounted on top of the gasket plate in an inverted geometry with respect to the body 20. In another embodiment, the body 20 and the cover plate 40 are identical. In another embodiment, the body 20 and the cover plate 40 are substantially similar. In another embodiment, the channels 28 within the body 20 are deeper than the channels within the cover plate 40. In another embodiment, the channels 28 within the body 20 are shallower than the channels within the cover plate 40. In another embodiment, the body 20 is thicker (the distance between upper end 22 and lower end 24) than the cover plate 40. In another embodiment, the body 20 is thinner than the cover plate 40.

The body 20, gasket plate 30, and cover plate 40 are held together or affixed by some means for fastening. Such means can be, for example, but not limited to, screws, nuts and bolts, clamp(s), etc. Similarly, the body 20, gasket plate 30, and cover plate 40 can be mounted onto a shaking component using a base plate 50. Such means for attaching or affixing the body, gasket plate, cover plate, and base plate to the shaking component can be a means for fastening, for example, but not limited to, screws, nuts and bolts, clamp(s), etc.

In another embodiment, the second array of openings is substantially similar (in the geometric sense) to the first array of openings and the third array of openings is substantially similar to the second array of openings. For example, the characteristic dimension (e.g., diameter) of each opening in an array is substantially the same. In one embodiment, the characteristic dimension of the third array is larger than or equal to the characteristic dimension of the second array and the characteristic dimension of the second array is larger than or equal to the characteristic dimension of the first array. In another embodiment, the height of each channel 28 is substantially the same as the height of each channel in the cover plate 40. In another embodiment, the height of each channel 28 is greater than the height of each channel in the cover plate 40. In another embodiment, the height of each channel 28 is less than the height of each channel in the cover plate 40.

In another embodiment, the apparatus has one or more of the following properties:
1) at least one apparatus loaded with powder and balls should be capable of (in one embodiment, but not limited to, less than 900 grams) being safely carried by a commercially available shaking component;
2) the material of the body 20 can be:
   a. hard enough to enable co-crystal formation;
   b. strong and tough enough to resist deformation and cracking;
   c. resistant to most solvents, acids and bases;
   d. chemically inert, so that the material of the body 20 will not react with one or more solids or solvents;
   e. the material of the body 20 should be of a density low enough to minimize the payload mass on the grinding apparatus; or
   f. the material of the body 20 should be capable of permitting operating temperatures of at least 60 degrees C. in order to allow heat assisted processing;
3) inner spaces (wells) have hemispherical caps (ends) in order to enable grinding ball to impact substantially everywhere over the surface (Wells should have a length smaller than the machine stroke to insure the grinding ball impacts each end);

4) the material used for the gasket plate should be chemically inert and create a tight seal by being compliant, non-porous, and having sufficient spring back (In one embodiment, but not limited to only this embodiment, EPDM rubber FDA grade, 1/16" thick, with a 40 Shore A durometer can be used); or 5) the well openings are selected to enable automatic dispensing of the co-crystal forming components (in one instance, for example, but not limited only to this instance, the well openings are selected to be greater than 0.25" so that they can be filled using an Autodose automated dispensing system). In other embodiments, smaller openings can be used to minimize active pharmaceutical ingredient (API) consumption. Other means for powder dispensing can be used.

In another embodiment, the component that provides the body 20, as shown in FIG. 1, is mounted on a shaking component, the lower end component of the lower plate 50 being disposed on the shaking component. In another embodiment, the lower plate 50 is an optional component of the apparatus. In one embodiment, but not limited only to this embodiment, a MiniBeadbeater-96 grinding unit made by Biospec Products, Inc. (POB 788, Bartlesville, Okla. 74005), which vibrates at 35 Hz at an amplitude of 31.8 mm, and has a payload capacity of 900 grams, can be used as the vibration source.

The methods and apparatuses of this invention can be utilizing for quickly assessing the effect of many combinations of reactants, catalysts, solvent (in low or high volume) and additive on the outcome of co-crystal synthesis. Co-crystal components may be dispensed as dry powders or as solutions or slurries. For example, a small amount of solvent may be added to two or more co-crystal components before grinding, in order to facilitate the formation of co-crystals. The dispensed reagents can be dried after dispensing or left wet. The reagents can be added in a single step or in several steps or portions. The mixtures can be analyzed using powder x-ray diffraction, single-crystal x-ray, differential scanning calorimetry, solution NMR, solid state NMR, infrared spectroscopy, FT-IR, IR microscopy, Raman spectroscopy, Raman microscopy, HPLC, LC-MS, laser desorption mass spectroscopy or other analytical techniques. The reactions can be carried out using inert, reactive or catalytic grinding media.

In another embodiment, the methods and apparatuses of the present invention can also be used to facilitate the formation of salts, solvates, hydrates, and polymorphs of one or more co-crystal components.

Although the invention has been described with respect to various embodiments, it should be realized this invention is also capable of a wide variety of further and other embodiments within the spirit of this invention.

EXAMPLES

Example 1

Carbamazepine:Saccharin Co-Crystal (Dry Grinding)

Mechanical grinding experiments were conducted by adding a small molar excess of saccharin (mp=228-230 degrees C.) to carbamazepine (mp=190-193 degrees C.) to a well in a 48-well plate (body) made of PEEK material. Each well contained 10 mg of carbamazepine and 5 mg to 10 mg of saccharin. A steel grinding ball was added to each well containing co-crystal components. A cover plate was attached to the well plate and the apparatus was attached to a mechanical shaker (Minibeadbeater-96+, 35 oscillations/second, Single-phase induction motor, 1 hp, (11.2 amp @ 115VAC or 5.6 amp @ 230VAC), Biospec products, Inc., Bartsville, Okla. 74005). The samples were ground for 20 minutes using the mechanical shaker. A carbamazepine:saccharin co-crystal was obtained. Melting point (mp) of co-crystal: 172-174 degrees C.

Example 2

Carbamazepine:Saccharin Co-Crystal (Wet Grinding)

Mechanical grinding experiments were conducted by adding a small molar excess of saccharin (mp=228-230 degrees C.) to carbamazepine (mp=190-193 degrees C) to a well in a 48-well plate (body) made of PEEK material. Each well contained 10 mg of carbamazepine and 5 mg to 10 mg of saccharin. 10 microliters of one of 24 solvents was added including, pentane, NMP, toluene, cyclohexane, ethyl acetate, DMA, heptane, DMSO, 2-butanol, propylene glycol, 1,4-dioxane, methanol, 1,2-dichloroethane, isopropyl alcohol, hexane, isopropyl acetate, trichloroethane, chlorobenzene, dichloromethane, nitromethane, chloroform, acetic acid, THF, and acetone. A steel grinding ball was added to each well containing co-crystal components. A cover plate was attached to the well plate and the apparatus was attached to a mechanical shaker (Minibeadbeater-96+, 35 oscillations/second, Single-phase induction motor, 1 hp, (11.2 amp @ 115VAC or 5.6 amp @ 230VAC), Biospec products, Inc., Bartsville, Okla. 74005). The samples were ground for 20 minutes using the mechanical shaker. A carbamazepine:saccharin co-crystal was obtained. Melting point (mp) of co-crystal: 172-174 degrees C.

Example 3

Carbamazepine:Nicotinamide Co-Crystal (Dry Grinding)

Mechanical grinding experiments were conducted by adding a small molar excess of nicotinamide (mp=128-131 degrees C.) to carbamazepine (mp=190-193 degrees C.) to a well in a 48-well plate (body) made of PEEK material. Each well contained 10 mg of carbamazepine and 5 to 10 mg of nicotinamide. A steel grinding ball was added to each well containing co-crystal components. A cover plate was attached to the well plate and the apparatus was attached to a mechanical shaker (Minibeadbeater-96+, 35 oscillations/second, Single-phase induction motor, 1 hp, (11.2 amp (115VAC or 5.6 amp @ 230VAC), Biospec products, Inc., Bartsville, Okla. 74005). The samples were ground for 20 minutes using the mechanical shaker. A carbamazepine:nicotinamide co-crystal was obtained. Melting point (mp) of co-crystal: 156-159 degrees C.

Example 4

Carbamazepine:Nicotinamide Co-Crystal (Wet Grinding)

Mechanical grinding experiments were conducted by adding a small molar excess of nicotinamide (mp=128-131 degrees C.) to carbamazepine (mp=190-193 degrees C.) to a well in a 48-well plate (body) made of PEEK material. Each well contained 10 mg of carbamazepine and 5 to 10 mg of nicotinamide. 10 microliters of methanol was added. A steel grinding ball was added to each well containing co-crystal components. A cover plate was attached to the well plate and the apparatus was attached to a mechanical shaker (Minibeadbeater-96+, 35 oscillations/second, Single-phase induction motor, 1 hp, (11.2 amp @ 115VAC or 5.6 amp @ 230VAC), Biospec products, Inc., Bartsville, Okla. 74005). The samples were ground for 20 minutes using the mechanical shaker. A carbamazepine:nicotinamide co-crystal was obtained. Melting point (mp) of co-crystal: 156-159 degrees C.

Example 5

Piracetam:Gentisic Acid Co-Crystal (Dry Grinding)

Mechanical grinding experiments were conducted by adding gentisic acid (mp=199-200 degrees C.) to piracetam (mp=151-153 degrees C.) to a well in a 48-well plate (body) made of PEEK material. Each well contained 15-20 mg of piracetam and 15-20 mg of gentisic acid. A steel grinding ball was added to each well containing co-crystal components. A cover plate was attached to the well plate and the apparatus was attached to a mechanical shaker (Minibeadbeater-96+, 35 oscillations/second, Single-phase induction motor, 1 hp, (11.2 amp @ 115VAC or 5.6 amp @ 230VAC), Biospec products, Inc., Bartsville, Okla. 74005). The samples were ground for 20 minutes using the mechanical shaker. A piracetam:gentisic acid co-crystal was obtained. Melting point (mp) of co-crystal: ~124 degrees C.

Example 6

Piracetam:Gentisic Acid Co-Crystal (Wet Grinding)

Mechanical grinding experiments were conducted by adding gentisic acid (mp=199-200 degrees C.) to piracetam (mp=151-153 degrees C.) to a well in a 48-well plate (body) made of PEEK material. Each well contained 15-20 mg of piracetam and 15-20 mg of gentisic acid. 5 microliters of one of 23 solvents was added including, water, nitromethane, n-hexane, MTBE, toluene, ethyl acetate, acetone, DMA, acetic acid, chlorobenzene, DMSO, acetonitrile, isopropyl acetate, 2-butanol, methyl ethyl ketone, NMP, methanol, tetrahydrofuran, benzyl alcohol, ethyl formate, ethanol, 1,2-dichloroethane, and dimethoxy ethane. A steel grinding ball was added to each well containing co-crystal components. A cover plate was attached to the well plate and the apparatus was attached to a mechanical shaker (Minibeadbeater-96+, 35 oscillations/second, Single-phase induction motor, 1 hp, (11.2 amp @ 115VAC or 5.6 amp @ 230VAC), Biospec products, Inc., Bartsville, Okla. 74005). The samples were ground for 20 minutes using the mechanical shaker. A piracetam:gentisic acid co-crystal was obtained. Melting point (mp) of co-crystal: ~124 degrees C.

What is claimed is:

1. A method of producing co-crystals, comprising:
   (a) providing a mixture of co-crystal components to at least one well of a body, wherein said at least one well has a maximum diameter of between about 5.00 mm and about 15.00 mm;
   (b) providing at least one grinding ball to said at least one well of said body;
   (c) affixing a cover plate, that is substantially physically congruent to said body, to said body;
   (d) affixing said body to a shaking component;
   (e) selecting a vibration frequency and a vibration amplitude for said shaking component; and
   (f) vibrating said body, whereby said vibrating results in co-crystal formation.

2. The method of producing co-crystals of claim 1, further comprising providing a small amount of a solvent to at least one well prior to step (c).

3. The method of producing co-crystals of claim 1, wherein said at least one well has an end-to-end length of between about 1.00 cm and about 5.00 cm.

4. The method of producing co-crystals of claim 1, wherein said at least one well terminates at both ends with a spherical end.

5. The method of producing co-crystals of claim 1, wherein said body or said cover plate is formed using the material polyetheretherketone.

6. The method of producing co-crystals of claim 1, wherein said at least one grinding ball is composed of a material selected from the group consisting of: stainless steel, tungsten carbide, bronze, brass, glass, and ceramics.

7. The method of producing co-crystals of claim 1, wherein said at least one grinding ball has a diameter of about from 0.50 to about 0.90 times the diameter of the well.

8. The method of producing co-crystals of claim 1, wherein said vibration frequency is about 35 Hz.

9. The method of producing co-crystals of claim 1, wherein said vibration frequency is about 53 Hz.

10. The method of producing co-crystals of claim 1, wherein said vibration amplitude ranges from about 10.00 mm to about 100.00 mm.

11. A method of producing co-crystals, comprising:
    (a) providing a mixture of co-crystal components to at least one well of a body, wherein said at least one well has an end-to-end length of between about 1.00 cm and about 5.00 cm;
    (b) providing at least one grinding ball to said at least one well of said body;
    (c) affixing a cover plate, that is substantially physically congruent to said body, to said body;
    (d) affixing said body to a shaking component;
    (e) selecting a vibration frequency and a vibration amplitude for said shaking component; and
    (f) vibrating said body, whereby said vibrating results in co-crystal formation.

12. A method of producing co-crystals, comprising:
    (a) providing a mixture of co-crystal components to at least one well of a body;
    (b) providing at least one grinding ball to said at least one well of said body;
    (c) affixing a cover plate, that is substantially physically congruent to said body, to said body;
    (d) affixing said body to a shaking component;
    (e) selecting a vibration frequency and a vibration amplitude for said shaking component, wherein said vibration amplitude ranges from about 10.00 mm to about 100.00 mm; and
    (f) vibrating said body, whereby said vibrating results in co-crystal formation.

* * * * *